(12) United States Patent
Aburakawa et al.

(10) Patent No.: US 11,676,767 B2
(45) Date of Patent: Jun. 13, 2023

(54) THIN FILM CAPACITOR HAVING A DIELECTRIC LAYER HAVING A THROUGH HOLE WHOSE INNER SURFACE HAS FIRST AND SECOND TAPERED SURFACES, CIRCUIT BOARD INCORPORATING THE SAME, AND THIN FILM CAPACITOR MANUFACTURING METHOD

(71) Applicant: TDK CORPORATION, Tokyo (JP)

(72) Inventors: Yuuki Aburakawa, Tokyo (JP); Tatsuo Namikawa, Tokyo (JP); Akiyasu Iioka, Tokyo (JP); Hitoshi Saita, Tokyo (JP); Kazuhiro Yoshikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 76 days.

(21) Appl. No.: 17/165,339

(22) Filed: Feb. 2, 2021

(65) Prior Publication Data
US 2021/0272757 A1 Sep. 2, 2021

(30) Foreign Application Priority Data
Feb. 27, 2020 (JP) .............................. JP2020-031758

(51) Int. Cl.
*H01G 4/33* (2006.01)
*H01G 4/008* (2006.01)
(Continued)

(52) U.S. Cl.
CPC .............. *H01G 4/33* (2013.01); *H01G 4/008* (2013.01); *H01G 4/306* (2013.01); *H01L 23/49822* (2013.01); *H01L 23/642* (2013.01); *H01G 4/1227* (2013.01); *H01G 4/1245* (2013.01); *H01G 4/1254* (2013.01)

(58) Field of Classification Search
CPC .......... H01G 4/33; H01G 4/008; H01G 4/306; H01G 4/1245; H01G 4/1254; H01G 4/1227; H01G 4/012; H01L 23/49822; H01L 23/642; H01L 24/16; H01L 2224/16238;
(Continued)

(56) References Cited

U.S. PATENT DOCUMENTS 4,894,115 A * 1/1990 Eichelberger ..... H01L 21/76804
134/1
5,302,547 A * 4/1994 Wojnarowski ....... H05K 3/0041
216/45
(Continued)

FOREIGN PATENT DOCUMENTS

JP 2018-206839 A 12/2018
WO WO-2021171336 A1 * 9/2021

*Primary Examiner* — David M Sinclair
*Assistant Examiner* — Daniel M Dubuisson
(74) *Attorney, Agent, or Firm* — Young Law Firm, P.C.

(57) ABSTRACT

Disclosed herein a thin film capacitor that includes a lower electrode layer, an upper electrode layer, and a dielectric layer disposed between the lower electrode layer and the upper electrode layer. The dielectric layer has a through hole. An inner wall surface of the through hole has a first tapered surface and a second tapered surface surrounded by the first tapered surface. The first and second tapered surfaces are not covered with the upper electrode layer and have respective first and second taper angles with respect to a surface of the lower electrode layer. The second taper angle is smaller than the first taper angle.

10 Claims, 6 Drawing Sheets

(51) Int. Cl.
*H01G 4/30* (2006.01)
*H01L 23/498* (2006.01)
*H01L 23/64* (2006.01)
*H01G 4/12* (2006.01)

(58) Field of Classification Search
CPC ........... H01L 2924/15313; H01L 25/16; H01L 23/49816
See application file for complete search history.

(56) References Cited

U.S. PATENT DOCUMENTS

| | | | | |
|---|---|---|---|---|
| 5,320,981 | A * | 6/1994 | Blalock | H01L 21/76804 |
| | | | | 257/E21.578 |
| 5,746,884 | A * | 5/1998 | Gupta | H01L 23/5226 |
| | | | | 257/E23.145 |
| 2001/0045419 | A1* | 11/2001 | Dunsky | B23K 26/042 |
| | | | | 219/121.61 |
| 2011/0156208 | A1* | 6/2011 | Kaneko | H01L 28/60 |
| | | | | 257/532 |
| 2012/0008295 | A1* | 1/2012 | Ouchi | H01L 23/3192 |
| | | | | 361/783 |
| 2018/0019205 | A1* | 1/2018 | Wei | H01L 21/823475 |
| 2018/0102219 | A1* | 4/2018 | Kumagae | H01G 4/012 |
| 2019/0035734 | A1* | 1/2019 | Ho | H01L 23/5226 |
| 2020/0006470 | A1* | 1/2020 | Chang | B81B 3/0086 |
| 2021/0124226 | A1* | 4/2021 | Cheng | G02F 1/136227 |

* cited by examiner

THIN FILM CAPACITOR HAVING A DIELECTRIC LAYER HAVING A THROUGH HOLE WHOSE INNER SURFACE HAS FIRST AND SECOND TAPERED SURFACES, CIRCUIT BOARD INCORPORATING THE SAME, AND THIN FILM CAPACITOR MANUFACTURING METHOD

BACKGROUND OF THE INVENTION

Field of the Invention

The present invention relates to a thin film capacitor and a circuit board incorporating the same and, more particularly, to a thin film capacitor in which a through hole is formed in a dielectric layer and a circuit board incorporating such a thin film capacitor. The present invention also relates to a manufacturing method for such a thin film capacitor.

Description of Related Art

Thin film capacitors have a structure in which a lower electrode layer and an upper electrode layer are connected through a dielectric layer as described in JP 2018-206839A. A thin film capacitor described in JP 2018-206839A has a through hole formed in a dielectric layer, and the through hole has a tapered inner wall.

When the upper electrode layer is formed on the tapered surface of the dielectric layer, the dielectric breakdown voltage of the dielectric layer becomes insufficient at this portion, so that the upper electrode layer cannot be disposed on the tapered surface of the dielectric layer. Thus, when the dielectric layer has a wide tapered surface (has a small taper angle), the area of the upper electrode layer decreases to reduce a capacitance by the reduction amount. The above disadvantage can be solved by narrowing the tapered surface (increasing the taper angle) of the dielectric layer; however, when the taper angle is large, a local stress may concentrate on the edge of the dielectric layer in embedding the thin film capacitor in a circuit board using a roll laminator or other means, which may cause cracks or peeling in the dielectric layer.

SUMMARY

It is therefore an object of the present invention to provide a thin film capacitor in which a through hole is formed in a dielectric layer and a circuit board incorporating such a thin film capacitor, capable of increasing reliability in mounting while ensuring a sufficient area of an upper electrode layer. Another object of the present invention is to provide a manufacturing method for a thin film capacitor having such a feature.

A thin film capacitor according to the present invention includes a lower electrode layer, an upper electrode layer, and a dielectric layer disposed between the lower electrode layer and the upper electrode layer. The dielectric layer has a through hole. The inner wall surface of the through hole has a first tapered surface and a second tapered surface positioned on the side closer to the center of the through hole than the first tapered surface is. The first and second tapered surfaces are not covered with the upper electrode layer and have respective first and second taper angles with respect to the surface of the lower electrode layer. The second taper angle is smaller than the first taper angle. A circuit board according to the present invention incorporates the above thin film capacitor.

According to the present invention, the taper angle of the second tapered surface positioned on the side close to the center of the through hole is small, and therefore, the edge of the through hole is less apt to suffer local stress, which hardly allows cracks or peeling to occur in the dielectric layer in the process of mounting the thin film capacitor in the circuit board. In addition, since the taper angle of the first tapered surface is large, it is possible to reduce an area where the upper electrode layer cannot be formed due to insufficient breakdown voltage.

In the present invention, the second tapered surface may be formed longer than the first tapered surface. In this case, the length of the first tapered surface may be 0.1 μm or more and 3 μm or less, and the length of the second tapered surface may be 1 μm or more and 10 μm or less. This can effectively prevent cracks or peeling.

In the present invention, the first taper angle may be 5° or more and 75° or less, and the second taper angle may be 3° or more and 45° or less. This can ensure a sufficient area of the upper electrode layer while preventing cracks or peeling.

In the present invention, the lower electrode layer may be made of Ni. Since Ni is high in Young's modulus, cracks or peeling is apt to occur in the dielectric layer; however, according to the present invention, it is possible to prevent cracks or peeling.

A thin film capacitor manufacturing method according to the present invention includes: a first step of forming a dielectric layer on the surface of a lower electrode layer; a second step of forming an upper electrode layer on the surface of the dielectric layer; and a third step of forming a through hole in the upper electrode layer and dielectric layer. The third step is performed by wet etching such that the inner wall surface of the through hole formed in the dielectric layer has a first tapered surface and a second tapered surface positioned on the side closer to the center of the through hole than the first tapered surface is, that the first and second tapered surfaces have respective first and second taper angles with respect to the surface of the lower electrode layer, and that the second taper angle is smaller than the first taper angle.

According to the present invention, the dielectric layer is wet etched such that the second taper angle is smaller than the first taper angle, so that it is possible to manufacture a thin film capacitor capable of achieving both sufficient capacitance and reliability.

In the present invention, the third step may include a first wet-etching step of wet etching the dielectric layer through a first mask having a diameter smaller than the diameter of the through hole of the dielectric layer and a second wet-etching step of wet etching the dielectric layer through a second mask having a diameter larger than the diameter of the first mask to form the first tapered surface in an area covered with the first mask and overlapping the opening of the second mask and to form the second tapered surface in an area overlapping the opening of the first and second masks. With this method, it is possible to reliably form the first tapered surface having a large taper angle and the second tapered surface having a small taper angle.

Alternatively, the third step may be performed by wet etching the dielectric layer through a mask having a diameter smaller than the diameter of the through hole formed in the dielectric layer to form the first tapered surface in an area covered with the mask and to form the second tapered surface in an area overlapping the opening of the mask. With this method, it is possible to form the first tapered surface having a large taper angle and the second tapered surface having a small taper angle by way of a small number of processes.

As described above, according to the present invention, there can be provided a thin film capacitor in which a through hole is formed in a dielectric layer and a circuit board incorporating such a thin film capacitor, capable of increasing reliability in mounting while ensuring a sufficient area of an upper electrode layer. Further, according to the present invention, there can be provided a manufacturing method for a thin film capacitor having such a feature.

BRIEF DESCRIPTION OF THE DRAWINGS

The above features and advantages of the present invention will be more apparent from the following description of certain preferred embodiments taken in conjunction with the accompanying drawings, in which:

FIG. 10 is a plan view of the through hole 30a;

DETAILED DESCRIPTION OF THE EMBODIMENTS

Hereinafter, a preferred embodiment of the present invention will be described in detail with reference to the accompanying drawings.

Figure 1:
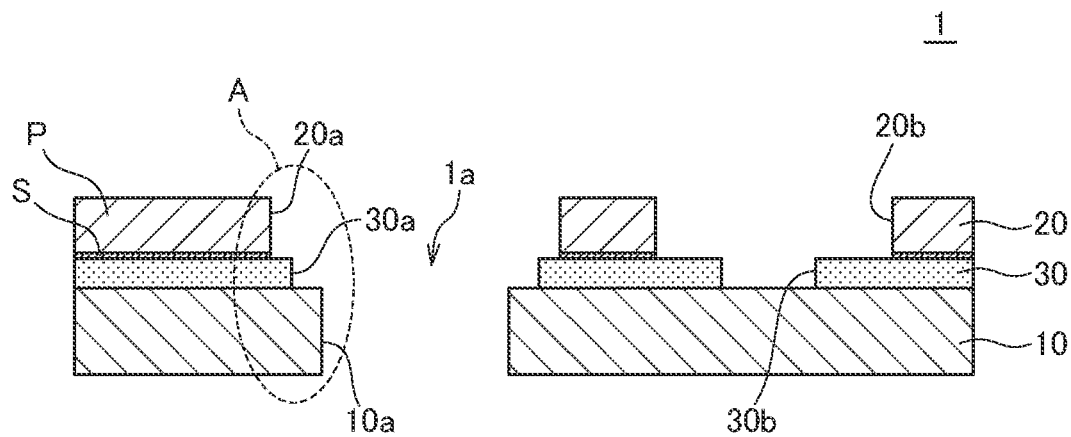
FIG. 1 is a schematic cross-sectional view for explaining the structure of a thin film capacitor 1 according to an embodiment of the present invention.

FIG. 1 is a schematic cross-sectional view for explaining the structure of a thin film capacitor 1 according to an embodiment of the present invention.

As illustrated in FIG. 1, the thin film capacitor 1 according to the present embodiment includes a lower electrode layer 10, an upper electrode layer 20, and a dielectric layer 30 disposed between the lower electrode layer 10 and the upper electrode layer 20. The lower electrode layer 10 serves as a base for the thin film capacitor 1 and is made of, e.g., Ni (nickel). The reason that Ni is used as the material of the lower electrode layer 10 is that, as will be described later, the lower electrode layer 10 is used as a support body for the dielectric layer 30 in the process of baking the dielectric layer 30 and thus needs to have high temperature durability.

The upper electrode layer 20 is made of, e.g., Cu (copper) and composed of a laminated film of a seed layer S and an electrolytic plating layer P.

The dielectric layer 30 is formed using a perovskite dielectric material. Examples of the perovskite dielectric material include: a ferroelectric or dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, and $Pb(Zr_xTi_{1-x})O_3$; a complex perovskite relaxer ferroelectric material represented by, e.g., $Pb(Mg_{1/3}Nb_{2/3})O_3$; a bismuth layered compound represented by, e.g., $Bi_4Ti_3O_{12}$ and $SrBi_2Ta_2O_9$; and tungsten bronze ferroelectric material represented by, e.g., $(Sr_{1-x}Ba_x)Nb_2O_6$ and $PbNb_2O_6$. Meanwhile, a ratio of A site and B site in the perovskite structure, perovskite relaxer ferroelectric material, bismuth layered compound, and tungsten bronze ferroelectric material is typically an integral ratio; however, it is allowable to intentionally depart the ratio from the integral ratio to improve the characteristics. An additive can be appropriately added to the dielectric layer 30 as an accessory component to control the characteristics of the dielectric layer 30. The thickness of the dielectric layer 30 is, e.g., 10 nm to 1000 nm.

The lower electrode layer 10 has a through hole 10a, the upper electrode layer 20 has through holes 20a and 20b, and the dielectric layer 30 has through holes 30a and 30b. The through holes 10a, 20a, and 30a overlap one another to form a through hole 1a penetrating the entire thin film capacitor 1.

The through holes 20b and 30b overlap each other to expose therethrough the lower electrode layer 10. The upper electrode layer 20 functions as one capacitance electrode of the thin film capacitor 1 and faces, through the dielectric layer 30, the lower electrode layer 10 that functions as the other capacitance electrode of the thin film capacitor 1.

Figure 2:
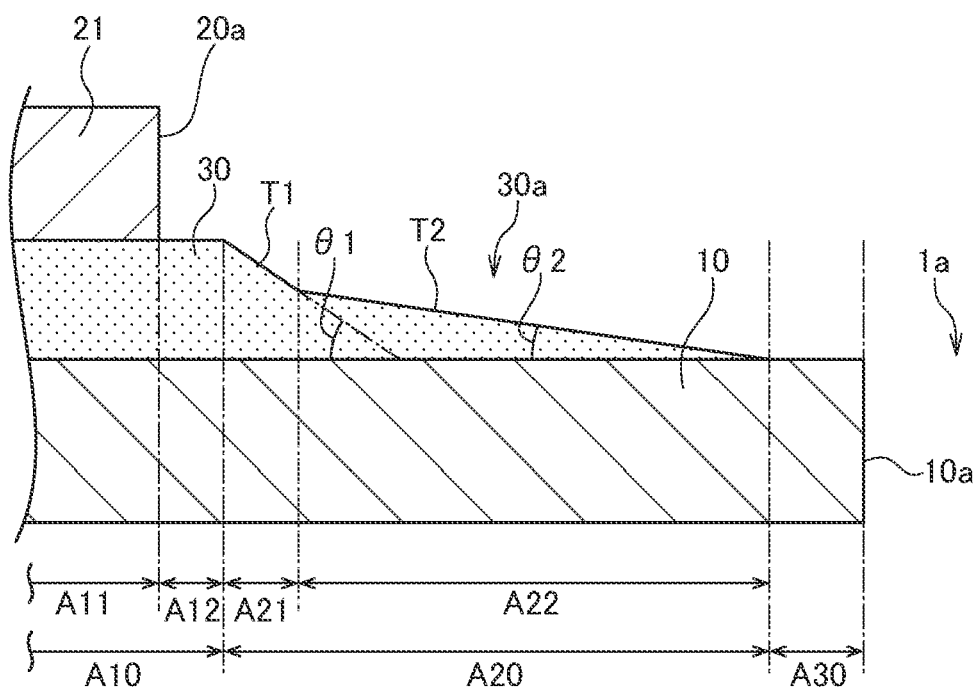
FIG. 2 is a schematic cross-sectional view illustrating an area A illustrated in FIG. 1 in an enlarged manner.

FIG. 2 is a schematic cross-sectional view illustrating an area A illustrated in FIG. 1 in an enlarged manner.

As illustrated in FIG. 2, the inner wall surface of the through hole 30a formed in the dielectric layer 30 is not vertical but inclined (tapered). That is, the thickness of the dielectric layer 30 decreases toward the center of the through hole 30a. Hereinafter, a flat surface area of the dielectric layer 30 is defined as an area A10, a tapered surface area of the dielectric layer 30 is as an area A20, and an area having no dielectric layer 30 is as an area A30. The area A20 includes an area A21 where the dielectric layer 30 has a tapered surface T1 and an area A22 where the dielectric layer 30 has a tapered surface T2. The area A21 is positioned on the side close to the area A10, and the area A22 is positioned on the side close to the area A30, i.e., on the side close to the center of the through hole 30a. Assuming that the taper angles of the tapered surfaces T1 and T2 are θ1 and θ2, respectively, θ1>θ2 is satisfied, which means that the taper angle θ2 is smaller than the taper angle θ1. In other words, a variation in film thickness of the dielectric layer 30 per unit length is smaller in the area A22 than in the area A21. The term "taper angle" refers to an angle formed by the surface of the lower electrode layer 10 and the tapered surface of the dielectric layer 30. The taper angle θ1 is, e.g., 5° or more and 75° or less, and the taper angle θ2 is, e.g., 3° or more and 45° or less.

The upper electrode layer 20 is absent in the area A20 and present in the area A10. The reason for this is that the film thickness of the dielectric layer 30 is small in the area A20, so that when the upper electrode layer 20 is formed in the area A20, the dielectric breakdown voltage of the dielectric layer 30 becomes insufficient. The upper electrode layer 20 is not formed in the entire surface of the area A10. Specifically, the upper electrode layer 20 is not formed on an area A12 of the area A10 that is adjacent to the area A20, but formed in an area A11 of the area A10 that is away from the boundary with the area A20. By thus setting the area A12 having no upper electrode layer 20, it is possible to prevent the upper electrode layer 20 from being formed in the area A20 even when a misalignment occurs.

Figure 3:
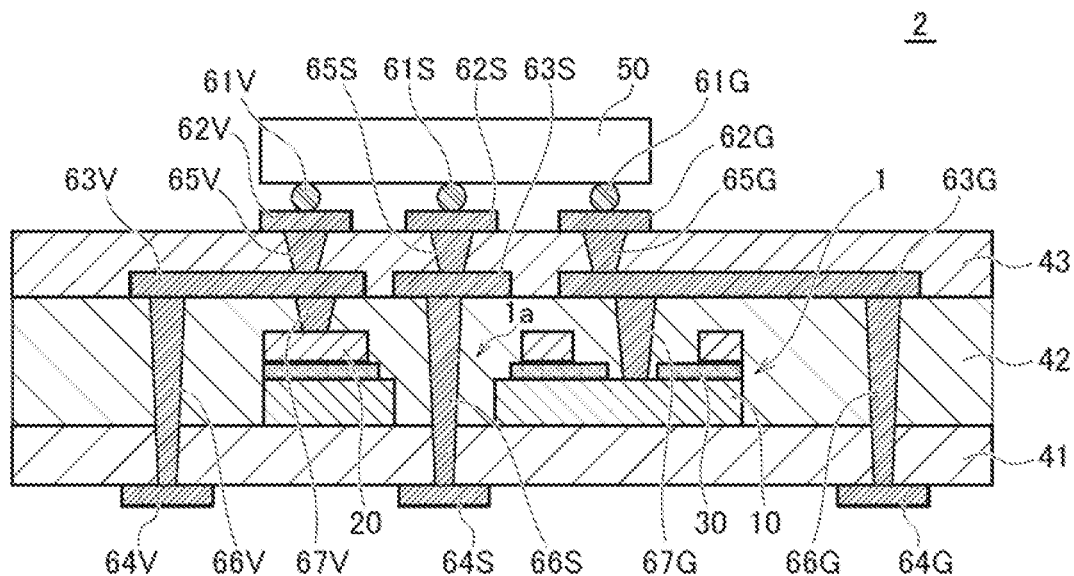
FIG. 3 is a schematic cross-sectional view of a circuit board 2 incorporating the thin film capacitor 1.

FIG. 3 is a schematic cross-sectional view of a circuit board 2 incorporating the thin film capacitor 1 according to the present embodiment.

In the circuit board 2 illustrated in FIG. 3, a plurality of insulating resin layers 41 to 43 are laminated, and the thin film capacitor 1 is embedded in the insulating resin layer 42. A semiconductor chip 50 is mounted on the upper surface of the circuit board 2. Further, the circuit board 2 is provided with power supply patterns 62V to 64V, ground patterns 62G to 64G, and signal patterns 62S to 64S. The power supply pattern 64V, ground pattern 64G, and signal pattern 64S each constitute an external terminal provided on the lower surface of the circuit board 2. The semiconductor chip 50, which is not particularly limited in type, has at least a power supply terminal 61V, a ground terminal 61G, and a signal terminal 61S. The terminals 61V, 61G, and 61S are connected to the power supply pattern 62V, ground pattern 62G, and signal pattern 62S, respectively.

The power supply pattern 62V is connected to the power supply pattern 63V through a via conductor 65V. The power supply pattern 63V is connected to the power supply pattern 64V through a via conductor 66V and to the upper electrode layer 20 of the thin film capacitor 1 through a via conductor 67V. The ground pattern 62G is connected to the ground pattern 63G through a via conductor 65G. The ground pattern 63G is connected to the ground pattern 64G through a via conductor 66G and to the lower electrode layer 10 of the thin film capacitor 1 through a via conductor 67G.

With the above configuration, a power supply potential is given to one capacitance electrode (upper electrode layer 20) of the thin film capacitor 1, and a ground potential is given to the other capacitance electrode (lower electrode layer 10), whereby a decoupling capacitor for the semiconductor chip 50 is constituted.

The signal pattern 62S is connected to the signal pattern 63S through a via conductor 65S. The signal pattern 63S is connected to the signal pattern 64S through a via conductor 66S passing through the through hole 1a. By thus forming the through hole 1a in the thin film capacitor 1, the via conductor 66S for signal can be connected to the signal pattern 64S at the shortest distance without making a large detour around the thin film capacitor 1.

Figure 4:
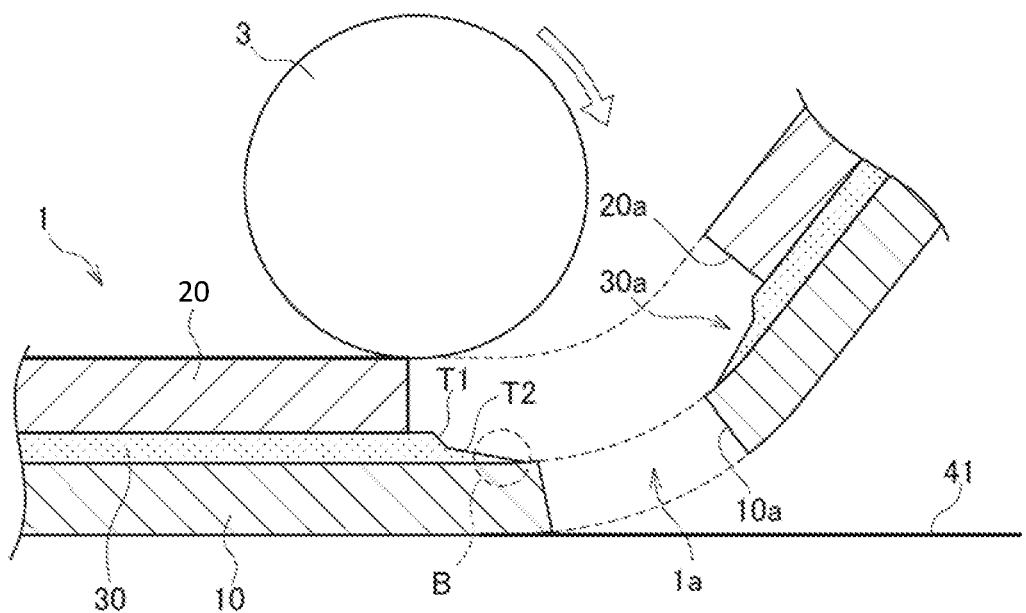
FIG. 4 is an enlarged schematic cross-sectional view for explaining a process of embedding the thin film capacitor 1 in the circuit board 2.

The thin film capacitor 1 can be embedded in the circuit board 2 using a roll laminator. Specifically, as illustrated in FIG. 4 which is a schematic enlarged cross-sectional view, after formation of the insulating resin layer 41, the thin film capacitor 1 is laminated on the surface of the insulating resin layer 41 while rotating a roll 3. In mounting the thin film capacitor 1 using the roll laminator, a bending stress is applied to the thin film capacitor 1 at a portion where the weight of the roll 3 is applied. At this time, when a high stress is applied to an area denoted by symbol B, i.e., the edge of the through hole 30a formed in the dielectric layer 30, cracks or peeling may occur in the dielectric layer 30 in some cases. Such a phenomenon is particularly noticeable when the Young's modulus of the lower electrode layer 10 is large.

However, in the thin film capacitor 1 according to the present embodiment, the edge of the through hole 30a formed in the dielectric layer 30 is not vertical but has the tapered surfaces T1 and T2, so that even when a high stress is applied, local stress concentration does not occur due to flexible deformation. Therefore, cracks or peeling is less apt to occur in the dielectric layer 30 in the process of embedding the thin film capacitor 1 in the circuit board 2, which increases product reliability. The stress can be dispersed more by constituting the edge of the through hole 30a only by the tapered surface T2 having the small taper angle θ2; however, in this case, the occupancy area of the area A20 increases to reduce a capacitance. In the present embodiment, the edge of the through hole 30a is not entirely constituted by the tapered surface T2, but the tapered surface T1 having the taper angle θ1 (>θ2) is provided between the area A22 and the area A10, the increase in the occupancy area of the area A20 can be suppressed. This can achieve both sufficient capacitance and reliability.

To prevent cracks or peeling in the dielectric layer 30, the tapered surface T2 is preferably longer than the tapered surface T1 (A22>A21). Specifically, the length of the tapered surface T1 is preferably set to 0.1 μm or more and 3 μm or less, and the length of the tapered surface T2 is preferably set to 1 μm or more and 10 μm or less.

The following describes a manufacturing method for the thin film capacitor 1 according to the present embodiment.

FIGS. 5 to 9 are process views for explaining a manufacturing method for the thin film capacitor 1 according to the present embodiment.

Figure 5:
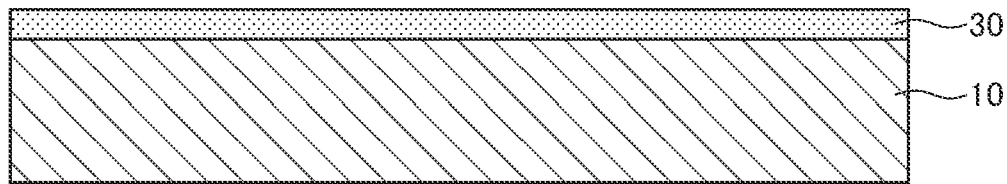
FIGS. 5 to 9 are process views for explaining a manufacturing method for the thin film capacitor 1.

As illustrated in FIG. 5, the lower electrode layer 10 made of Ni and having a thickness of about 15 μm is prepared, and the dielectric layer 30 made of, e.g., barium titanate is formed on the surface of the lower electrode layer 10 and baked. Although the lower electrode layer 10 is subjected to high temperature at this time, it can endure the baking temperature by being made of high-melting point metal such as Ni.

Figure 6:
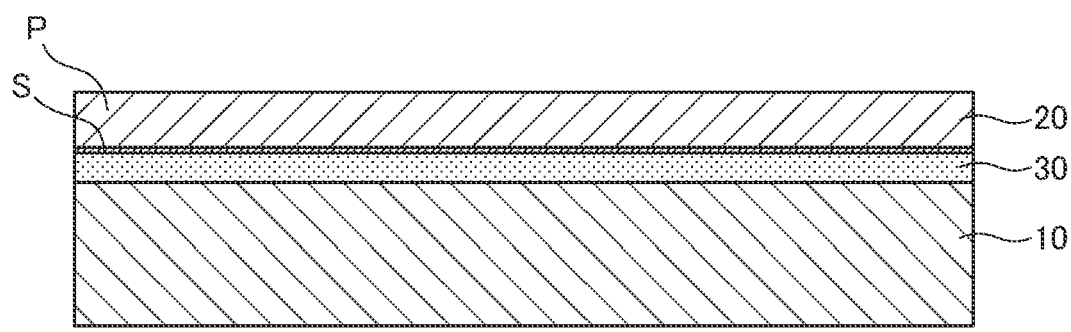

Then, as illustrated in FIG. 6, the upper electrode layer 20 is formed on the surface of the dielectric layer 30. The upper electrode layer 20 can be obtained by forming the seed layer S in small thickness using sputtering or electroless plating and then by performing electrolytic plating using the seed layer S as a feeder. Thus, the upper electrode layer 20 composed of a laminated body of the thin seed layer S and thick electrolytic plating layer P is formed.

Figure 7:
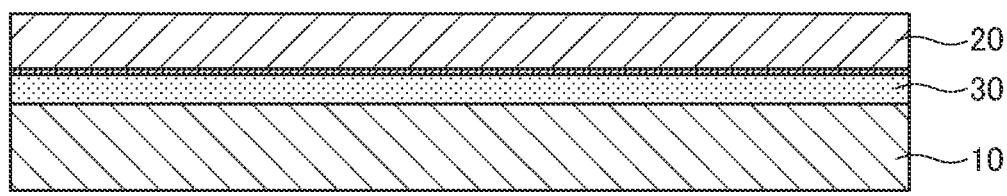
Figure 8:
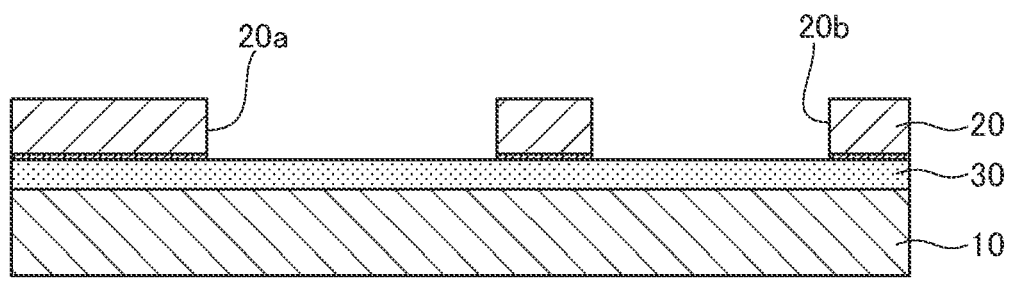
Figure 9:
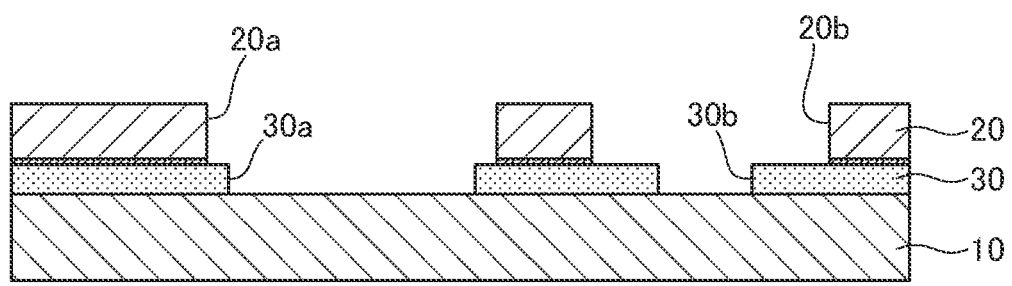

Then, the lower electrode layer 10 is reduced in thickness to, e.g., about 10 μm as illustrated in FIG. 7, and the upper electrode layer 20 is patterned to form the through holes 20a and 20b as illustrated in FIG. 8. Subsequently, as illustrated in FIG. 9, parts of the dielectric layer 30 that are exposed through the through holes 20a and 20b are patterned to form the through holes 30a and 30b.

Figure 10:
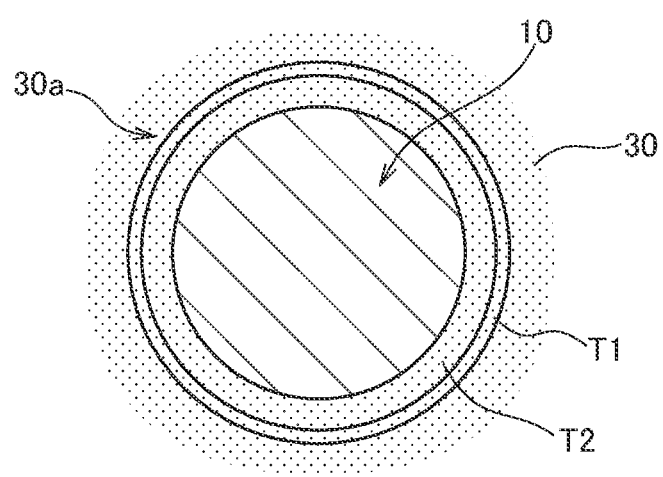

FIG. 10 is a plan view of the through hole 30a. In the example of FIG. 10, the through hole 30a has a circular planar shape and has an inner wall surface constituted by the ring-shaped tapered surface T1 and the ring-shaped tapered surface T2 positioned inside the tapered surface T1. As described above, the taper angle θ2 of the tapered surface T2 is smaller than the taper angle θ1 of the tapered surface T1. There is no particular restriction on the method of forming the tapered surfaces T1 and T2 having such characteristics, and they can be formed as follows, for example.

Figure 11A:
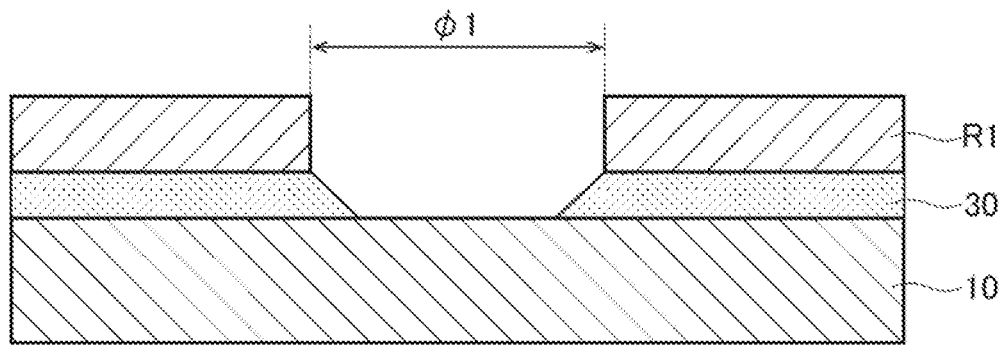
FIG. 11A is a process view for explaining aspects of a first process of forming a tapered surface T1 and a tapered surface T2.

As illustrated in FIG. 11A, a mask R1 having an opening with a diameter of φ1 is formed on the surface of the dielectric layer 30, and then the dielectric layer 30 is wet etched through the mask R1. The diameter φ1 of the opening of the mask R1 is designed smaller than the diameter of the through hole 30a to be finally formed. A usable etchant is a mixed solution of ammonium fluoride and hydrochloric acid. At this time, the composition and temperature of the etchant, etching time, a supply method of the etchant, and other conditions are adjusted so as to make side etching difficult to progress. As a result, the inner wall surface of the through hole 30a is tapered.

Figure 11B:
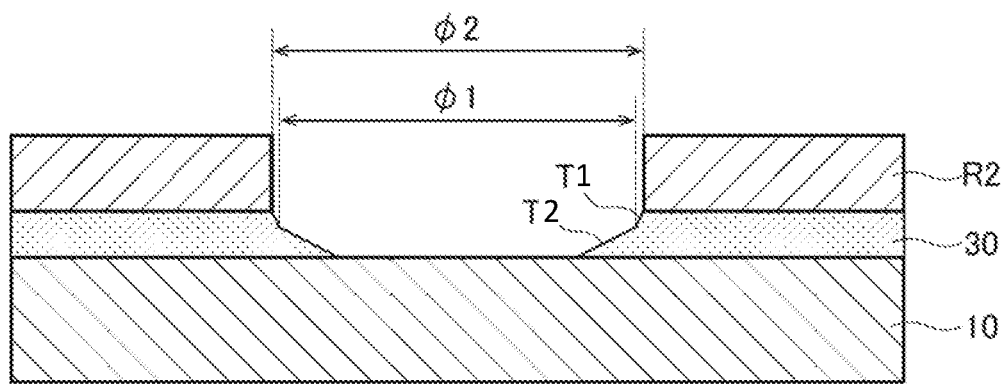
FIG. 11B is a process view for explaining further aspects of a first process of forming a tapered surface T1 and a tapered surface T2.

Then, as illustrated in FIG. 11B, after removal of the mask R1, a mask R2 having an opening with a diameter of ϕ2 is formed on the surface of the dielectric layer 30, and the dielectric layer 30 is wet etched once again through the mask R2. The diameter ϕ2 of the opening of the mask R2 is designed larger than the diameter ϕ1 of the opening of the mask R1 and substantially the same or slightly smaller than the diameter of the through hole 30a to be finally formed. A usable etchant is a mixed solution of ammonium fluoride and hydrochloric acid. At this time, the composition and temperature of the etchant, etching time, a supply method of the etchant, and other conditions are adjusted so as to facilitate progress of side etching. Thus, a new etched surface of the dielectric layer 30 has a large taper angle. The part having a large taper angle corresponds to the tapered surface T1, and the part having a small taper angle positioned inside the tapered surface T1 corresponds to the tapered surface T2.

As described above, by performing the two-stage wet etching using the different masks R1 and R2, it is possible to reliably form the tapered surface T1 having the large taper angle θ1 and the tapered surface T2 having the small taper angle θ2.

Figure 12:
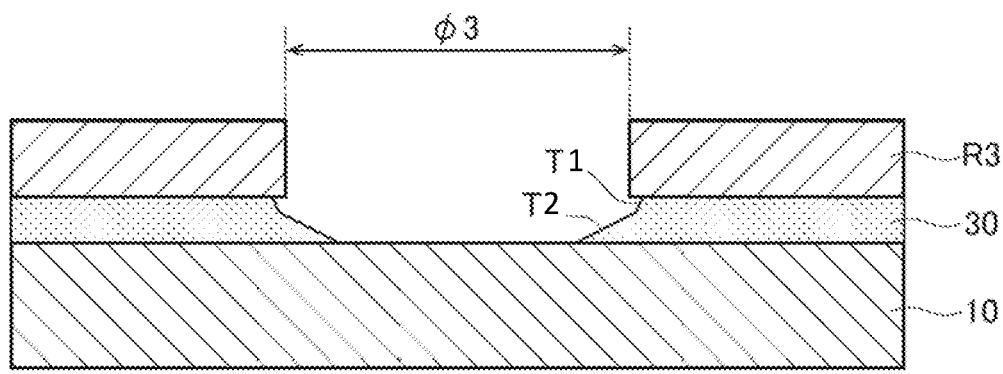
FIG. 12 is a process view for explaining a second process of forming the tapered surface T1 and the tapered surface T2.

Alternatively, as illustrated in FIG. 12, a mask R3 having an opening with a diameter of ϕ3 is formed on the surface of the dielectric layer 30, and the dielectric layer 30 is wet etched through the mask R3. The diameter ϕ3 of the opening of the mask R3 is designed smaller than the diameter of the through hole 30a to be finally formed. A usable etchant is a mixed solution of ammonium fluoride and hydrochloric acid. At this time, the composition and temperature of the etchant, a supply method of the etchant, and other conditions are adjusted, and the etching time is set long so as to further facilitate progress of side etching. This makes it possible to make the diameter of the through hole 30a larger than the diameter ϕ3 of the opening of the mask R3. A part of the lower electrode layer 10 that is covered with the mask R3 becomes the tapered surface T1 having the large taper angle θ1 due to progress of the side etching, and a part of the lower electrode layer 10 that overlaps the opening of the mask R3 becomes the tapered surface T2 having the small taper angle θ2.

Thus, by side-etching the dielectric layer 30, it is possible to form the tapered surface T1 having the large taper angle θ1 and the tapered surface T2 having the small taper angle θ2 by way of a less number of processes.

To accurately control the side etch amount in the methods illustrated in FIGS. 11 and 12, the crystal of, e.g., barium titanate constituting the dielectric layer 30 preferably has a columnar structure. This makes the etching rate higher in the planar direction than in the thickness direction, thereby facilitating progress of the side etching, which in turn facilitates the control of the taper angle of the through hole 30a.

Then, a part of the lower electrode layer 10 that is exposed through the through hole 30a is patterned to form the through hole 10a, whereby the thin film capacitor 1 according to the present embodiment illustrated in FIG. 1 is completed.

As described above, in the present embodiment, wet etching for forming the through hole 30a in the dielectric layer 30 is performed under the condition that the tapered surface T1 having the large taper angle θ1 and the tapered surface T2 having the small taper angle θ2 are formed, so that it is possible to prevent cracks or peeling in the dielectric layer 30 which may occur at mounting of the thin film capacitor 1 in the circuit board 2 while ensuring a sufficient area of the upper electrode layer 20.

It is apparent that the present invention is not limited to the above embodiments, but may be modified and changed without departing from the scope and spirit of the invention.

Figure 13:
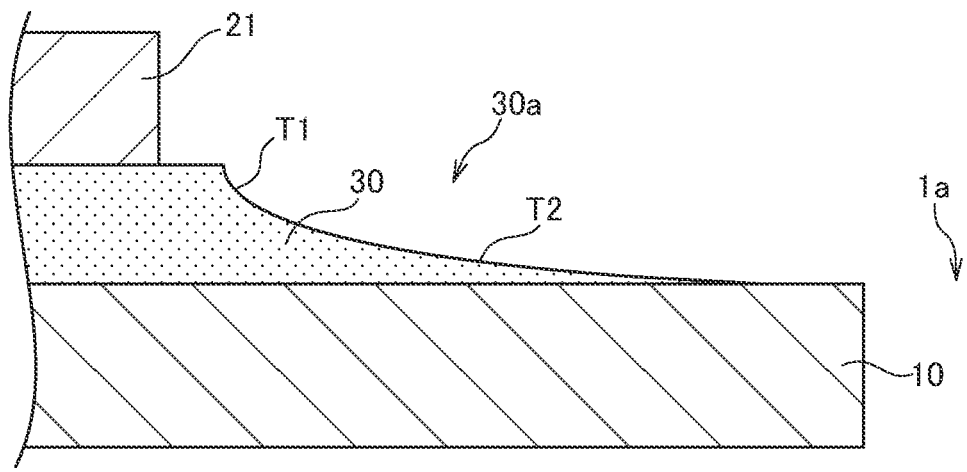
FIG. 13 is a schematic cross-sectional view for explaining a tapered shape of the through hole 30a according to a first modification.
Figure 14:
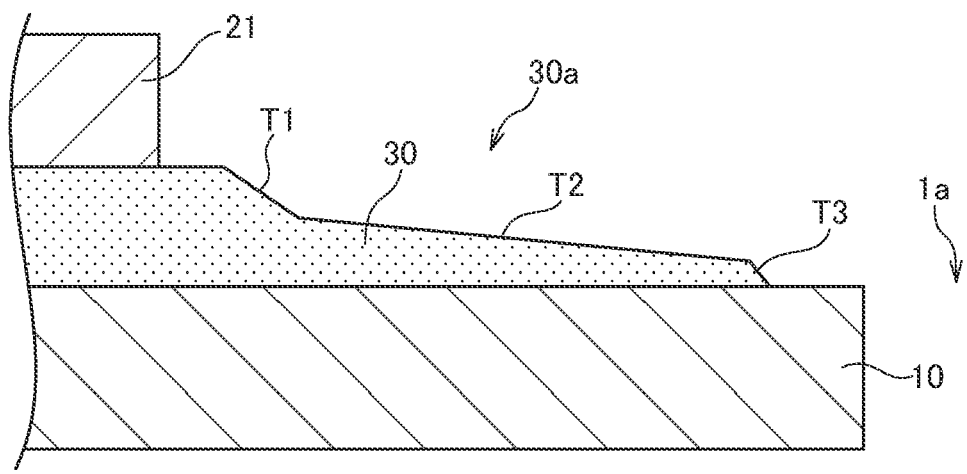
FIG. 14 is a schematic cross-sectional view for explaining a tapered shape of the through hole 30a according to a second modification.

For example, there is a clear boundary between the tapered surfaces T1 and T2 constituting the inner wall surface of the through hole 30a in the above embodiment; however, as illustrated in FIG. 13, the taper angle may continuously change to eliminate a clear boundary between the tapered surfaces T1 and T2. Further, as illustrated in FIG. 14, another tapered surface T3 having a taper angle larger than that of the tapered surface T2 may be formed on the side closer to the center of the through hole 30a than the tapered surface T2 is.

What is claimed is:
1. A thin film capacitor comprising:
a lower electrode layer having an upper surface;
an upper electrode layer having a lower surface; and
a dielectric layer disposed between the lower electrode layer and the upper electrode layer such that a lower surface of the dielectric layer faces the upper surface of the lower electrode layer, such that an upper surface of the dielectric layer faces the lower surface of the upper electrode layer, and such that a part of the upper surface of the lower electrode layer is exposed without being covered by the dielectric layer,
wherein the dielectric layer has a through hole, wherein the lower electrode layer has another through hole that overlaps the through hole of the dielectric layer, and wherein the part of the upper surface of the lower electrode layer is ring-shaped and surrounds the through hole of the lower electrode layer,
wherein an inner wall surface of the through hole has a first tapered surface and a second tapered surface surrounded by the first tapered surface,
wherein the first and second tapered surfaces are not covered with the upper electrode layer and have respective first and second taper angles with respect to the upper surface of the lower electrode layer, and
wherein the second taper angle is smaller than the first taper angle,
wherein a part of the upper surface of the dielectric layer is exposed without being covered by the upper electrode layer, and
wherein the part of the upper surface of the lower electrode layer is greater in width than the part of the upper surface of the dielectric layer.
2. The thin film capacitor as claimed in claim 1, wherein the second tapered surface is formed longer than the first tapered surface.
3. The thin film capacitor as claimed in claim 2,
wherein a length of the first tapered surface is 0.1 μm or more and 3 μm or less, and
wherein a length of the second tapered surface is 1 μm or more and 10 μm or less.
4. The thin film capacitor as claimed in claim 1,
wherein the first taper angle is 5° or more and 75° or less, and
wherein the second taper angle is 3° or more and 45° or less.

5. The thin film capacitor as claimed in claim 1, wherein the lower electrode layer comprises Ni.

6. The thin film capacitor as claimed in claim 1, wherein the part of the upper surface of the dielectric layer is ring-shaped surrounding the inner wall surface of the through hole.

7. A circuit board incorporating a thin film capacitor, the thin film capacitor comprising:
a lower electrode layer having an upper surface;
an upper electrode layer having a lower surface; and
a dielectric layer disposed between the lower electrode layer and the upper electrode layer such that a lower surface of the dielectric layer faces the upper surface of the lower electrode layer, such that an upper surface of the dielectric layer faces the lower surface of the upper electrode layer, and such that a part of the upper surface of the lower electrode layer is exposed without being covered by the dielectric layer,
wherein the dielectric layer has a through hole, wherein the lower electrode layer has another through hole that overlaps the through hole of the dielectric layer, and wherein the part of the upper surface of the lower electrode layer is ring-shaped and surrounds the through hole of the lower electrode layer,
wherein an inner wall surface of the through hole has a first tapered surface and a second tapered surface surrounded by the first tapered surface,
wherein the first and second tapered surfaces are not covered with the upper electrode layer and have respective first and second taper angles with respect to the upper surface of the lower electrode layer, and
wherein the second taper angle is smaller than the first taper angle,
wherein a part of the upper surface of the dielectric layer is exposed without being covered by the upper electrode layer, and
wherein the part of the upper surface of the lower electrode layer is greater in width than the part of the upper surface of the dielectric layer.

8. A thin film capacitor comprising:
a lower electrode layer having an upper surface;
an upper electrode layer having a lower surface; and
a dielectric layer disposed between the lower electrode layer and the upper electrode layer such that a lower surface of the dielectric layer faces the upper surface of the lower electrode layer, and such that an upper surface of the dielectric layer faces the lower surface of the upper electrode layer,
wherein the lower electrode layer has a first through hole,
wherein the upper electrode layer has a second through hole,
wherein the dielectric layer has a third through hole,
wherein the first, second, and third through holes overlap with other,
wherein the third through hole is greater in a diameter than the first through hole, thereby the upper surface of the lower electrode layer includes a first ring-shaped region exposed without being covered by the dielectric layer,
wherein the second through hole is greater in a diameter than the third through hole, thereby the upper surface of the dielectric layer includes a second ring-shaped region that is exposed without being covered by the upper electrode layer, and
wherein an inner wall surface of the third through hole is tapered and includes a first tapered surface, a second tapered surface surrounded by the first tapered surface and a third tapered surface surrounded by the second tapered surface,
wherein a first taper angle between the upper surface of the lower electrode layer and the first tapered surface is greater than a second taper angle between the upper surface of the lower electrode layer and the second tapered surface, and wherein a third taper angle between the upper surface of the lower electrode layer and the third tapered surface is greater than the second taper angle.

9. The thin film capacitor as claimed in claim 8, wherein the second tapered surface is greater in width than the first tapered surface.

10. The thin film capacitor as claimed in claim 8, wherein the first tapered surface is greater in width than the third tapered surface.

* * * * *